United States Patent [19]

Kummer

[11] Patent Number: 4,937,575
[45] Date of Patent: Jun. 26, 1990

[54] PRECISION A/D CONVERTER UTILIZING A MINIMUM OF INTERFACE INTERCONNECTIONS

[75] Inventor: Karl T. Kummer, Doylestown, Pa.

[73] Assignee: Honeywell Inc., Minneapolis, Minn.

[21] Appl. No.: 259,064

[22] Filed: Oct. 18, 1988

[51] Int. Cl.$^5$ .............................................. H03M 1/18
[52] U.S. Cl. .................................. 341/118; 341/120; 341/139; 341/141; 341/155
[58] Field of Search ............... 341/118, 120, 139, 141, 341/142, 155, 165

[56] References Cited

U.S. PATENT DOCUMENTS

| | | | |
|---|---|---|---|
| 4,141,065 | 2/1979 | Sumi et al. | 341/141 |
| 4,149,256 | 4/1979 | Sumi et al. | 341/122 |
| 4,151,518 | 4/1979 | Jansson et al. | 341/138 |
| 4,309,767 | 1/1982 | Andow et al. | 341/120 |
| 4,425,561 | 1/1984 | Whiteside et al. | 341/120 |
| 4,510,569 | 4/1985 | Takao et al. | 341/142 |
| 4,567,466 | 1/1986 | Bozarth et al. | 341/139 |

Primary Examiner—William M. Shoop, Jr.
Assistant Examiner—Gary J. Romano
Attorney, Agent, or Firm—Arthur A. Sapelli; D. J. Lenkszus; A. Medved

[57] ABSTRACT

An A/D converter circuit generates a precise digital signal which accurately corresponds to an analog input signal. The A/D converter comprises a converter element, having a first and second, input terminal for receiving control signals, and having an output terminal, and further having at least one analog input terminal. The analog input signal is coupled to the analog input terminal, for converting the analog input signal to an uncorrected digital signal. The uncorrected digital signal includes inaccuracies of the parameter differentials of the converter element. A memory unit, stores information defining the actual parameter values of the converter element. A processor, controls the conversion of the analog input signal to the precise digital signal, wherein the actual parameter values are applied to the uncorrected digital signal thereby removing the inaccuracies of the converter element to obtain the precise digital signal.

4 Claims, 4 Drawing Sheets

PRECISION A/D CONVERTER UTILIZING A MINIMUM OF INTERFACE INTERCONNECTIONS

BACKGROUND OF THE INVENTION

This invention relates to an interface circuit for processing electrical signals, and more particularly, to an analog/digital (A/D) converter circuit.

In a process control system, various parameters of a predetermined operation along a process must be monitored in order to coordinate/control each operation which makes up the total process, thereby controlling the overall process. These parameters oftentimes take the form of an analog signal, which are inputted to the process control system. In order for a digital processor or digital computer of the process control system to utilize these inputs they must be converted to a digital signal. The analog to digital converter (often times referred to herein as A/D converter) performs this function. Precision A/D converters can be obtained but generally have associated therewith a high cost. The present invention provides a precision A/D converter circuit using inexpensive components. Further the circuit configuration of The present invention minimizes the number of terminals required to interface with the other subsystems or circuits of the system, in particular, with the digital processor.

SUMMARY OF THE INVENTION

Therefore, there is supplied by the present invention, an analog to digital converter circuit for generating a precise digital signal which accurately corresponds to an analog input signal. The A/D converter comprises a converter element, having a first and second, input terminal for receiving control signals, and having an output terminal, and further having at least one analog input terminal. The analog input signal is operatively coupled to the analog input terminal, for converting the analog input signal to an uncorrected digital signal. The uncorrected digital signal includes inaccuracies of the parameter differentials of the converter element. A memory unit, operatively connected to the converter element stores information defining the actual parameter values of the converter element. A processor, operatively connected to the first and second input terminal of the converter element for coupling a first and second control signal to converter element, and further operatively connected to the output terminal of the converter element, controls the conversion of the analog input signal to the precise digital signal, wherein the actual parameter values are applied to the uncorrected digital signal thereby removing the inaccuracies of the converter element to obtain the precise digital signal.

Accordingly, it is a object of the present invention to provide an analog to digital converter.

It is another object of the present invention to provide an analog to digital converter circuit using readily available components.

It is a further object of the present invention to provide an analog to digital converter circuit using standard components.

It is still another object of the present invention to provide an analog to digital converter circuit utilizing inexpensive components.

It is still a further object of the present invention to provide an analog to digital converter circuit utilizing inexpensive components yielding high precision results.

It is still another object of the present invention to provide an analog to digital converter circuit using inexpensive components yielding high precision results having a minimum of interface connections.

These and other objects of the present invention will become more apparent when taken in conjunction with the following description and attached drawings, wherein like characters indicate like parts and which drawings form a part of the present application.

DETAILED DESCRIPTION

Figure 1:
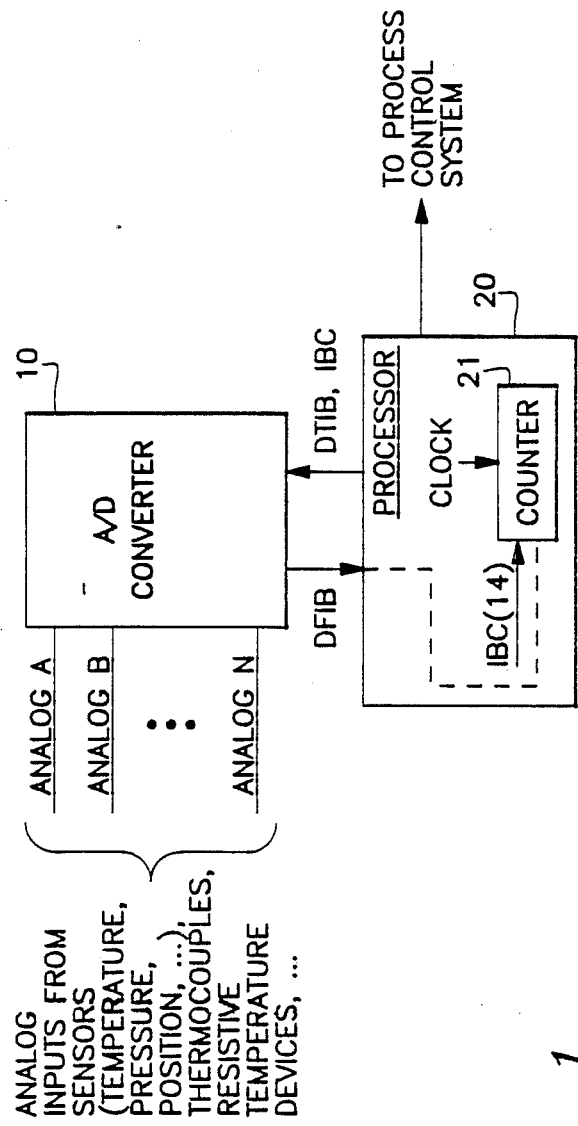
FIG. 1 shows a partial block diagram of a process control system in which the present invention may be utilized.

Referring to FIG. 1, there is shown a partial block diagram of a process control system in which the analog to digital (A/D) converter circuit of the present invention may be found. In a process control system there is generally included an interface device for coupling measured parameters of interest to a main processor (not shown) which controls the total process. The parameter types may vary depending on the process being controlled, but may include valve settings, fluid flow, fluid flow rate, temperature, pressure, level, position,... . Devices such as sensors, transducers, thermocouples,... measure these parameters and generate an analog electrical output signal. This signal is coupled to an A/D converter circuit 10, which converts the analog signal to a digital signal such that it is usable by the various digital processors of the process control system. The digital signal outputted from the A/D converter 10 has a digital value corresponding to the value of the analog signal. A digital processor 20, coupled to the A/D converter circuit 10, performs some preprocessing operations on the corresponding digital signal before coupling the digital signal to the main processor (not shown) of the process control system. The preprocessing performed in the preferred embodiment of the present invention is the correction of the digital signal received from the A/D converter 10 in order to remove the inaccuracies inherent in the A/D converter circuits. The actual parameter values of the A/D converter circuits are stored with the A/D converter 10, which may vary from the nominal (or specified or typical) value. By applying the actual values to the digital signal, the inaccuracies are thus removed. The control signals from the processor (or sometimes referred to herein as digital processor) 20 are clock and data (IBC and DTIB), and the input to the processor 20 denoted as DFIB. A counter 21 within the processor 20 and the operation of the A/D converter will be described in further detail hereinunder.

Figure 2:
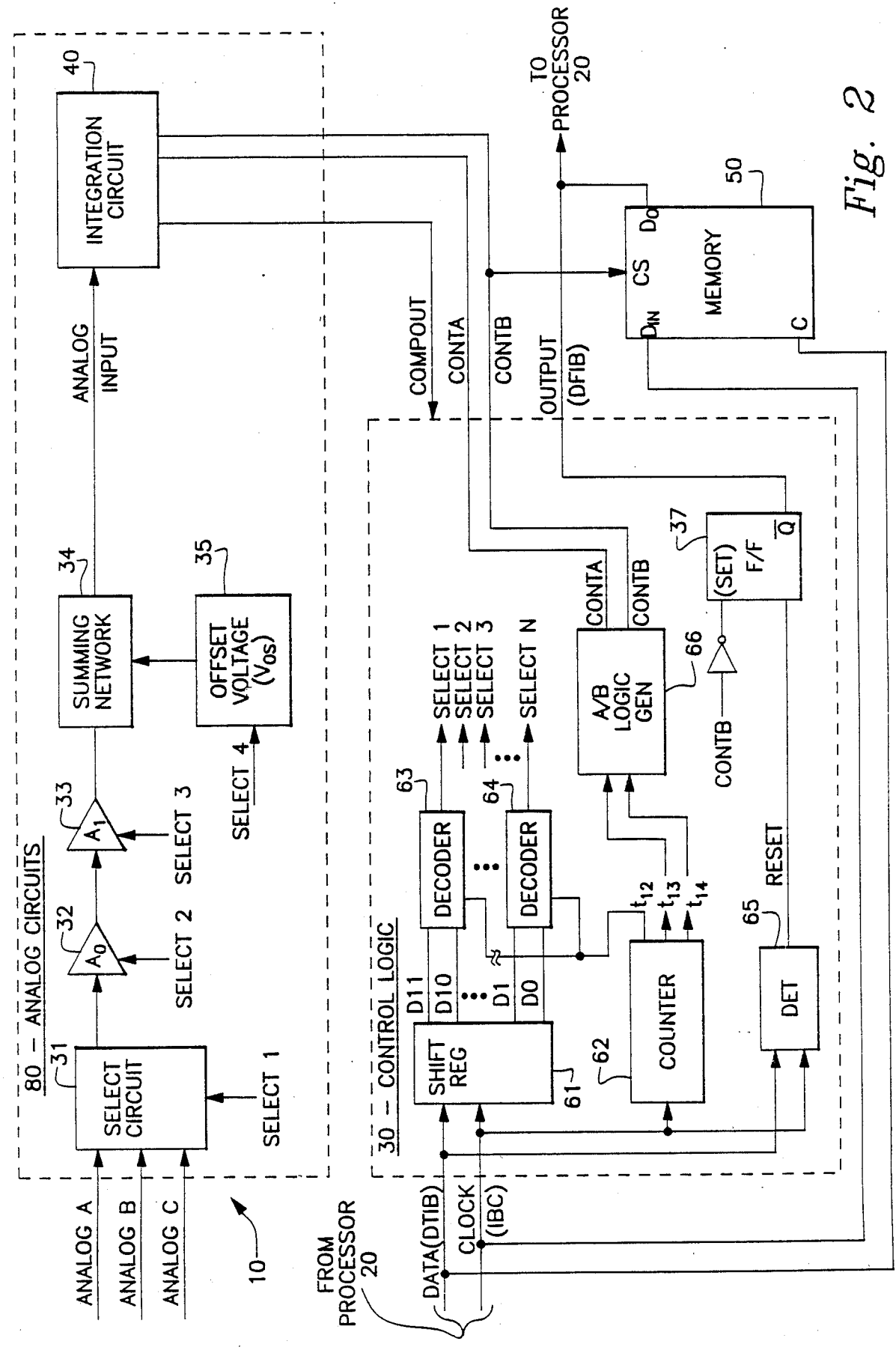
FIG. 2 shows a functional block diagram of the analog to digital (A/D) converter circuit of the present invention.

Referring to FIG. 2, there is shown a functional block diagram of the A/D converter circuit 10 of the preferred embodiment of the present invention. The analog signal input from the sensor device is coupled to an analog A input terminal or an analog B input terminal of an analog circuit 80, depending on the sensor type. In the preferred embodiment of the present invention, the analog C input terminal is always at a 0 volt level. The analog input signal is coupled through a select circuit 31 and a first and second input amplifier $A_0$, $A_1$, respectively, 32, 33. The analog signal is then coupled to a summing network 34, the output being coupled to an analog input terminal of an integration circuit 40. (The select circuit 31, first input amplifier $A_0$ 32, second input amplifier $A_1$ 33, summing network 34, an offset voltage generator 35, and integration circuit 40, comprise what is referred to herein as the analog circuits 80.) The integration circuit 40 of the preferred embodiment of the present invention is a dual slope A/D converter which converts the analog input voltage to a time pulse such that, in conjunction with the counter 21 of the processor 20 a corresponding digital signal is generated which corresponds to the magnitude of the analog input signal. Characteristic parameters (or more simply parameters) of the analog circuits 80, previously measured (e.g. at the factory) and stored in a memory 50 associated with the analog circuit 80, are applied to the digital signal by the digital processor 20, in order to obtain a corrected digital signal. The correction compensates for the nominal or rated values of the analog circuit 80 as compared to the actual (or measured) parameter values of the analog circuit 80, i.e. the parameter differentials.

Figure 3:
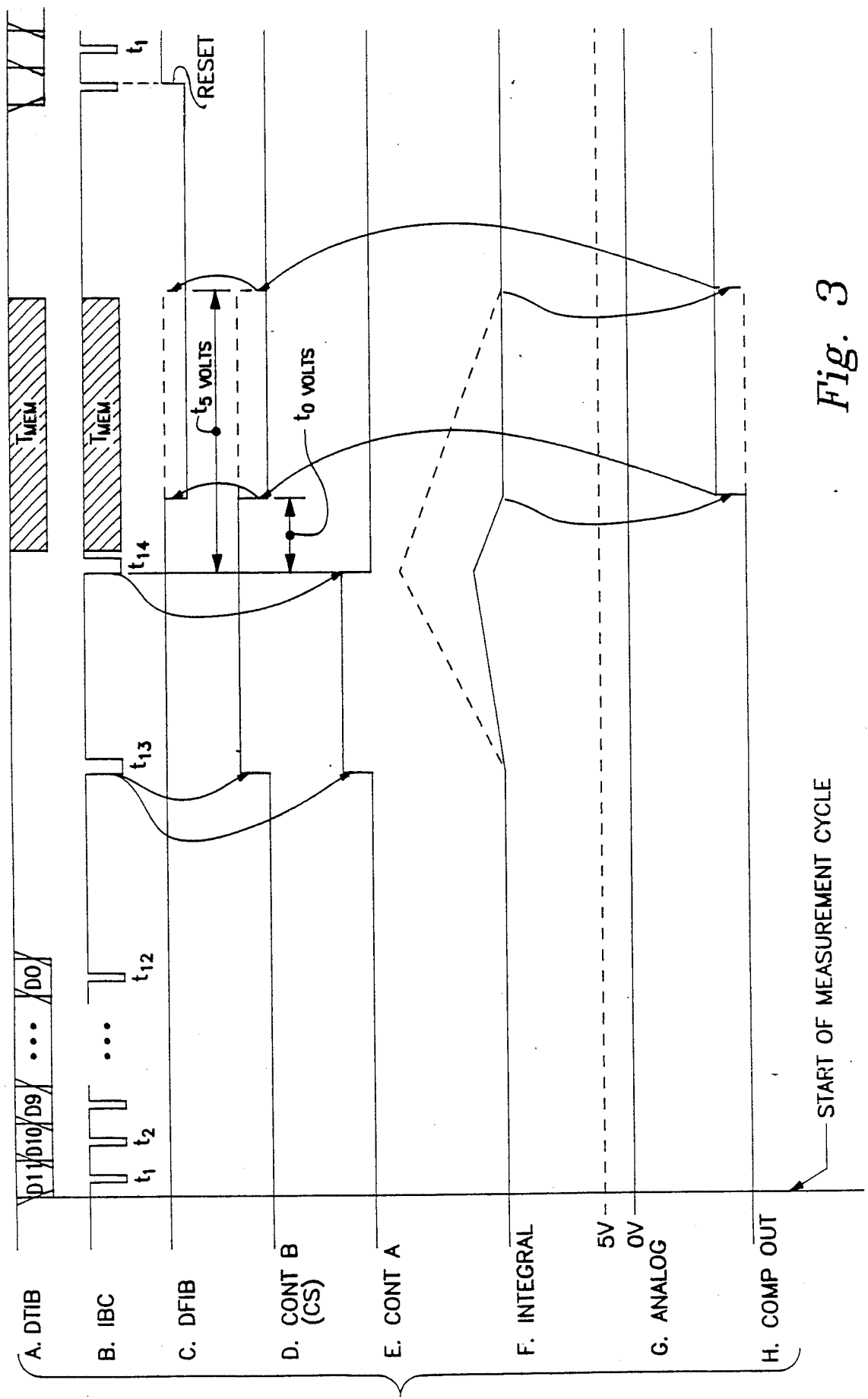
FIG. 3 shows a timing diagram of the A/D circuit of the preferred embodiment of the present invention of FIG. 2.

Referring to FIG. 3, there is shown a timing diagram of the A/D converter 10 of the preferred embodiment of the present invention. The operation of the A/D converter 10 will now be described in conjunction with FIGS. 2 and 3.

The digital processor 20 initiates the operation of the A/D converter 10 by transmitting a data signal and a clock signal (DTIB and IBC, respectively, FIGS. 3A and 3B) to a control logic unit 30. The DTIB (data) signal includes twelve bits of information $D_{11}$ thru $D_0$. The control logic unit 30 includes a shift register 61, which clocks the DTIB signal into the shift register 61 until all twelve data bits are received. A counter 62 counts the clock pulses and provides control signals $t_{12}$, $t_{13}$, and $t_{14}$, which indicates the twelfth, thirteenth and fourteenth clock pulses. The control signal $t_{12}$ enables decoders 63, 64 which decodes the input data bits and generates select signals SELECT1, SELECT2, ... SELECTN. The SELECT1 signal is coupled to the select circuit 31 and selects the analog input signal from the analog A terminal, analog B terminal, or analog C terminal. Thus $D_{11}$ and $D_{10}$ of the input data signal define which input terminal is to be selected. In a similar fashion the SELECT2 signal is generated by decoding predetermined input data bits and selects the gain associated with the input amplifier $A_0$, 32. Similarly the predetermined data bits are decoded to generate the SELECT3 signal which is coupled to the input amplifier $A_1$, 33 for selecting an associated gain factor. It will be understood by those skilled in the art that in order to select between two alternative gain factors a single bit can define the gain factor to be selected. Similarly two bits will be required to select between four gain factors, three bits will required to select between eight gain factors, ... . A generator which generates an offset voltage 35 ($V_{OS}$) is inputted to the summing network 34. The select signal SELECT4 is inputted to the offset voltage generator 35 to select one of a predetermined number of offset values which are to be inputted to the summing network 34. Depending on the range of the input voltage it may be necessary to add an offset voltage in order to obtain a positive resultant voltage out of the summing network in order for the integration circuit 40 to operate properly. The output of the A/D converter 10 (DFIB, FIG. 3C) is a level which at the start of a measurement cycle is high and is coupled to the digital processor 20. A flip-flop 37 functionally depicts the output signal generator and is reset at the start of the measurement cycle. The control signal $t_{13}$ is outputted from counter 62 to A/B logic generator (A/B LOGIC GEN) 66 for generating the Control A and Control B output signals (FIG. 3E and 3D, respectively). The circuit necessary to generate these output signals is well known in the art and will not be discussed further herein. The Control A (CONTA) and the Control B (CONTB) signal is coupled to the integration circuit 40, which indicates the start of the integration of the analog input signal to the integration circuit 40. After a fixed predetermined time, the digital processor 20 transmits the $t_{14}$ clock signals of the measurement cycle, is counted by counter 62 outputting a control signal $t_{14}$ to the A/B logic generator 66 causing the CONTA signal to go low. When this signal goes low, the integration circuit 40 starts to integrate down an is as shown in FIG. 3F. The solid line of the integral (FIG. 3F) corresponds to an analog input signal of 0 volts (FIG. 3G) and the dotted line of FIG. 3F corresponds to an input analog signal of 5 volts (FIG. 3G). On the integration down cycle, when the value of the integral reaches 0 the integration circuit 40 generates a comparator output signal (COMPOUT), FIG. 3H, which is coupled to the control logic 30. This signal causes the CONTB signal to go low, which in turn causes the output signal DFIB to go low. The DFIB signal is coupled to the digital processor 20. The digital processor 20 contains the counter 21 which starts counting at the time the $t_{14}$ signal is transmitted to the A/D converter 10. When the DFIB signal which is coupled to the counter 21 of the digital processor 20 goes low, the counter 21 of the digital processor 20 stops counting. The value within the counter 21 of the digital processor 20 contains the value of the analog input signal in digital form. The digital processor 20 then applies the correction factors which are obtained from the memory 50, to obtain an accurate digital signal which corresponds to the analog input signal. The correction basically consists of subtracting the offset value and multiplying the result by nominal gain divided by the measured or actual gain. The processor 20 of the preferred embodiment is an INTEL 8031 microcontroller with some supporting circuits. A detector (DET) 65 has coupled to its input the DTIB and IBC signals for detecting a condition in which the IBC signal is going high while the DTIB signal is low. Such a condition generates the reset signal. The integration circuit 40 of the preferred embodiment is a Texas Instruments TL500 integrated circuit chip.

The memory 50 has stored therein the various parameters which define some characteristics of the analog circuits 80. Included are the offset value and the gain value for the different operating ranges of the analog circuit 80. These values are read by the digital processor 20 at the beginning of the normal operation and stored within its internal memory, and at other various predefined times, such as during readiness checking, diagnostic checking,. . . . The values stored in the memory 50 are not required to be read every measurement cycle. The memory 50 in the preferred embodiment of the present invention is a 1024 bit serial EEPROM, specifically the National Semiconductor NMC9346 integrated circuit. Further, in order to insure that the operation of the integration circuit is not confused during transmissions to the memory 50, the data line DTIB from digital processor 20 is coupled to the memory 50 clock input (C) and the clock input IBC is coupled to the data in ($D_{IN}$) of memory 50. The data output terminal of the memory 50 ($D_O$) is coupled to the the output line DFIB to the A/D converter 10. The control signal CONTB is coupled to the chip select (or chip enable) of the memory 50. Thus when the digital processor 20 is communicating with the digital controller 30 specifically for the purpose of measuring the analog input signal, the memory is disabled. Only during the period of time from $t_{13}$ until the CONTB output signal goes low is the memory unit 50 enabled. The crosshatched area of FIGS. 3A and 3B denoted as $T_{mem}$ is a time when the digital processor 20 is specifically communicating with the memory 50. Further during the start of the measurement cycle the digital processor 20 causes analog input C to be selected at the select circuit 31, and causes an offset voltage $V_{os}$ to be selected such that the input to the summing network 34 has an output of five volts. This ensures the time period as denoted in FIG. 3 for communicating with the memory 50. It will be recognized by those skilled in the art that the input lines DTIB and IBC alternate functions. Specifically from the start of the measurement cycle to the time $t_{13}$, DTIB couples data signals and IBC couples clock signals to the A/D converter 10 (i.e., control logic 30). From the point in time $t_{13}$ until RESET (CS of memory 50 is high enabling the memory 50), DTIB couples clock signals and IBC couples data signals to the A/D converter 10, more specifically to the memory 50. This altering of signal function of the DTIB and IBC lines will become more apparent in the following description of FIG. 5.

Figure 4:
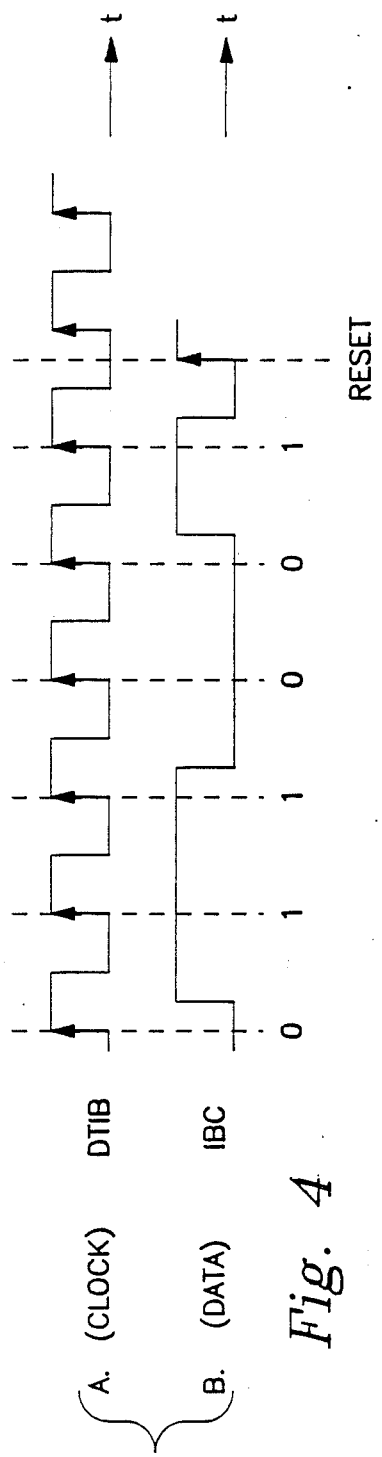
FIG. 4 shows a timing diagram of the relationship between the data and clock signals.

The input signals to the digital controller 30 are depicted in FIG. 4. The DTIB line contains the clock signal shown as a signal having a periodic repetition rate and the IBC line contains the data. The combinations of having a 0 followed by a 1, a 1 followed by a 1, a 1 followed by a 0, and a 0 followed by a 0 are shown. Also shown are the conditions necessary to generate the reset signals by the digital processor 20.

Figure 5:
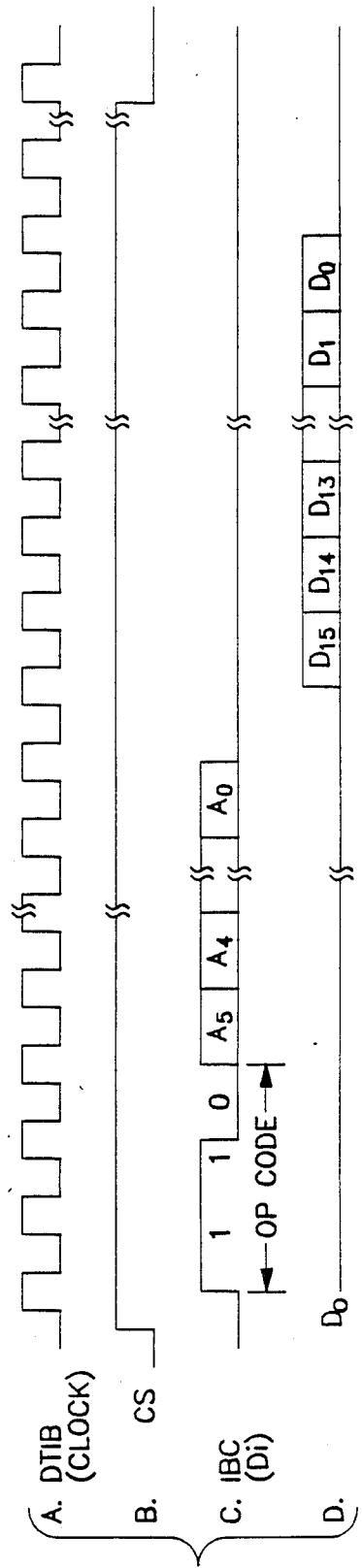
FIG. 5 shows a timing diagram of the communication between a processor and a memory unit of the A/D converter circuit.

Referring to FIG. 5 there is shown the communications necessary with the memory 50 in order to read the data stored therein. The chip select signal (FIG. 5B) must be high. The DTIB signal contains the clock signal which is coupled to the clock input of the memory 50, and the data which is on the IBC line is coupled to the data input terminal of the memory 50. The first three bits contain the operation code which corresponds to a read operation. The next six bits contain the address of the location to be read, followed by the data output line containing the outputted information. The outputted information is coupled to the DFIB line which is then coupled to the digital processor 20. Since the digital processor 20 initiated the read operation, the information on the DFIB line (output) which is utilized for generating the digital signal within converter 21 is ignored. Once the parameters are stored within the memory of the digital processor 20, no further reads are necessary except as mentioned above.

The parameters stored in the memory 50 are associated with its corresponding analog circuits 80. These parameters are generally measured and stored in the factory and need not be performed otherwise, because, in the preferred embodiment of the present invention, the integration circuit 40 (including the remainder of the analog circuits 80), the control logic 30, and the memory unit form a single unit, ie., these elements are mounted on a single card and are carried/changed as a unit. It is within this context that the A/D converter 10 can be considered as combined to form a unit.

It will be understood by those skilled in the art that various alternatives may be implemented embodying the scope of the present invention. For example the digital processor 20 may address multiple A/D converter 10 utilizing some data bits on the data input $D_{11}$ to $D_0$ to address one of a plurality of A/D converters. Individual lines coupled from the digital processor 20 may address a corresponding number of A/D converters. A plurality of A/D converters may share a single memory 50. Likewise additional combinations of the elements may be utilized.

While there has been shown what is considered the preferred embodiment of the present invention, it will be manifest that may changes and modifications can be made therein without departing from the essential spirit and scope of the invention. It is intended, therefore, in the annexed claims to cover all such changes and modifications which fall within the true scope of the invention.

I claim:
1. An A/D converter, for generating a precise digital signal which accurately corresponds to an analog input signal, comprising:
 (a) integration circuit means, having at least one analog input terminal, the analog input signal being operatively coupled to the analog input terminal, for generating a count control signal, wherein the count control signal is at a first predetermined level and changes to a second predetermined level when conversion of the analog input signal to an uncorrected digital signal is completed, the point in time in which the change to said second predetermined level occurs from a predetermined point in time being proportional to the value of the analog input signal, the uncorrected digital signal including inaccuracies of parameter differentials of the A/D converter.
 (b) counter means, operatively connected to said integration circuit means, for counting a clocking signal, having a predetermined frequency, from the predetermined point in time to the point in time in which the count control signal changes to the second predetermined level, the counter means containing the uncorrected digital signal upon completion of the count;
 (c) controller means, having a first and second input terminal for receiving first and second control signals, and having an output terminal, for controlling the integration circuit means in response to the control signals;
 (d) memory means, operatively connected to the controller means and to the integration circuit means, for storing information defining the actual parameter values of the A/D converter; and
 (e) processor means, operatively connected to the first and second input terminal of said controller means for coupling a first and second control signal to said controller means, and further operatively connected to the output terminal of said controller means, for controlling the conversion of said analog input signal to said precise digital signal, wherein said actual parameter values are applied to the uncorrected digital signal thereby removing the inaccuracies of the A/D converter means to obtain said precise digital signal.

2. An A/D converter, for generating a precise digital signal according to claim 1, wherein said memory means:

is operatively connected to said first and second input terminal of said controller converter means and wherein said memory means comprises a memory having an input terminal and an output terminal, information transfers between said memory means and said processor means being serial information transfers according to a predetermined protocol, said first and second terminals of the controller converter means being the same terminals utilized as connection points for the transfer of information between said controller converter means and said processor means, thereby minimizing the number of interface connections of said A/D converter.

3. An A/D converter, for generating a precise digital signal according to claim 2, wherein the A/D converter parameter values stored in said memory means include the actual parameter values of the integration circuit means.

4. An A/D converter, for generating a precise digital signal according to claim 1, wherein said memory means is semi-permanently associated with said integration circuit means.

* * * * *